(12) United States Patent
Kapinos et al.

(10) Patent No.: US 11,224,131 B2
(45) Date of Patent: Jan. 11, 2022

(54) SYSTEMS AND METHODS FOR SURFACE MOUNTING CABLE CONNECTIONS

(71) Applicant: Lenovo (Singapore) Pte. Ltd., New Tech Park (SG)

(72) Inventors: Robert James Kapinos, Durham, NC (US); Robert James Norton, Jr., Raleigh, NC (US); Russell Speight VanBlon, Raleigh, NC (US); Scott Wentao Li, Cary, NC (US)

(73) Assignee: LENOVO (SINGAPORE) PTE. LTD., New Tech Park (SG)

( * ) Notice: Subject to any disclaimer, the term of this patent is extended or adjusted under 35 U.S.C. 154(b) by 218 days.

(21) Appl. No.: 15/945,489

(22) Filed: Apr. 4, 2018

(65) Prior Publication Data
US 2019/0313534 A1    Oct. 10, 2019

(51) Int. Cl.
| | |
|---|---|
| *H05K 1/00* | (2006.01) |
| *H05K 1/02* | (2006.01) |
| *H05K 1/09* | (2006.01) |
| *H05K 1/11* | (2006.01) |
| *H05K 1/14* | (2006.01) |
| *H05K 1/18* | (2006.01) |
| *H05K 3/00* | (2006.01) |
| *H05K 3/30* | (2006.01) |
| *H05K 3/32* | (2006.01) |
| *H05K 3/34* | (2006.01) |
| *H05K 3/36* | (2006.01) |
| *H05K 3/40* | (2006.01) |
| *H05K 3/46* | (2006.01) |
| *H01R 12/62* | (2011.01) |
| *H01B 7/08* | (2006.01) |

(52) U.S. Cl.
CPC .......... *H05K 3/321* (2013.01); *H01B 7/0823* (2013.01); *H01R 12/62* (2013.01); *H05K 1/111* (2013.01); *H05K 1/181* (2013.01); *H05K 2201/10356* (2013.01); *H05K 2203/166* (2013.01)

(58) Field of Classification Search
CPC .. H05K 1/00; H05K 1/02; H05K 1/09; H05K 1/11; H05K 1/14; H05K 1/18; H05K 3/00; H05K 3/30; H05K 3/32; H05K 3/34; H05K 3/36; H05K 3/40; H05K 3/46
USPC ........ 174/260, 254, 257, 259, 261; 361/750, 361/771, 803; 439/66, 371, 492, 493; 252/510; 257/43
See application file for complete search history.

(56) References Cited

U.S. PATENT DOCUMENTS

| | | | | |
|---|---|---|---|---|
| 5,484,647 A | * | 1/1996 | Nakatani | H05K 3/4069 361/748 |
| 5,688,584 A | * | 11/1997 | Casson | H05K 3/323 174/259 |

(Continued)

*Primary Examiner* — Xiaoliang Chen
(74) *Attorney, Agent, or Firm* — The Small Patent Law Group LLC; Dean D. Small

(57) ABSTRACT

A method and device are provided. The device includes a system component that has a circuit board that includes a cable connection portion. The cable connection portion is disposed on and extends along a mounting surface, and includes board pads disposed on the mounting surface within the cable connection portion. The board pads define corresponding board contact surfaces for electrical coupling with connector pads, and include a board adhesive material disposed on the corresponding board contact surfaces.

7 Claims, 3 Drawing Sheets

(56) References Cited

U.S. PATENT DOCUMENTS

| | | | | | |
|---|---|---|---|---|---|
| 5,727,310 | A * | 3/1998 | Casson | H05K 3/323 | 29/830 |
| 5,920,465 | A * | 7/1999 | Tanaka | H01R 12/62 | 361/749 |
| 5,959,709 | A * | 9/1999 | Asada | G02F 1/13452 | 349/150 |
| 6,299,713 | B1 * | 10/2001 | Bejtlich | B23K 20/023 | 156/292 |
| 8,120,188 | B2 * | 2/2012 | Sakurai | H01L 24/11 | 257/778 |
| 8,501,583 | B2 * | 8/2013 | Kitae | H05K 3/3436 | 257/678 |
| 9,226,408 | B2 * | 12/2015 | Bang | H05K 1/147 | |
| 9,414,502 | B2 * | 8/2016 | Wu | H05K 3/36 | |
| 2001/0055073 | A1 * | 12/2001 | Shinomiya | H01L 27/14618 | 348/374 |
| 2002/0008681 | A1 * | 1/2002 | Hanakawa | G02F 1/1345 | 345/87 |
| 2002/0008815 | A1 * | 1/2002 | Hanakawa | G02F 1/133553 | 349/113 |
| 2002/0075439 | A1 * | 6/2002 | Uehara | G02F 1/1309 | 349/149 |
| 2002/0081894 | A1 * | 6/2002 | Fuerst | H01R 12/613 | 439/492 |
| 2003/0034127 | A1 * | 2/2003 | Segawa | H05K 3/361 | 156/325 |
| 2003/0142444 | A1 * | 7/2003 | Tan | G11B 5/4853 | 360/234.6 |
| 2003/0231275 | A1 * | 12/2003 | Shirato | G02F 1/13452 | 349/149 |
| 2005/0151271 | A1 * | 7/2005 | Tatsuzawa | C09J 7/10 | 257/783 |
| 2005/0219230 | A1 * | 10/2005 | Nakayama | G06F 3/016 | 345/173 |
| 2005/0230802 | A1 * | 10/2005 | Vindasius | H01L 21/563 | 257/686 |
| 2005/0288427 | A1 * | 12/2005 | Jeon | C08F 283/00 | 524/555 |
| 2007/0001313 | A1 * | 1/2007 | Fujimoto | H01L 24/11 | 257/778 |
| 2007/0242038 | A1 * | 10/2007 | Hsu | H01H 13/702 | 345/156 |
| 2009/0166544 | A1 * | 7/2009 | Gasse | H01L 27/14676 | 250/370.09 |
| 2009/0175019 | A1 * | 7/2009 | Koyama | H05K 3/323 | 361/803 |
| 2010/0012358 | A1 * | 1/2010 | Tatsuzawa | C09J 9/02 | 174/257 |
| 2010/0018755 | A1 * | 1/2010 | Tatsuzawa | C09J 9/02 | 174/254 |
| 2010/0025097 | A1 * | 2/2010 | Kojima | C09J 9/02 | 174/261 |
| 2010/0051330 | A1 * | 3/2010 | Yamashita | C09J 9/02 | 174/255 |
| 2010/0206623 | A1 * | 8/2010 | Kawate | C09J 163/00 | 174/259 |
| 2010/0220072 | A1 * | 9/2010 | Chien | G06F 3/041 | 345/173 |
| 2010/0221533 | A1 * | 9/2010 | Tatsuzawa | H05K 3/323 | 428/343 |
| 2010/0277885 | A1 * | 11/2010 | Tatsuzawa | C09J 9/02 | 361/803 |
| 2010/0321908 | A1 * | 12/2010 | Shiota | H05K 3/323 | 361/771 |
| 2011/0122337 | A1 * | 5/2011 | Shimizu | G02F 1/13452 | 349/61 |
| 2011/0122356 | A1 * | 5/2011 | Saimen | H05K 1/0269 | 349/149 |
| 2011/0139500 | A1 * | 6/2011 | Hara | H01R 12/62 | 174/259 |
| 2011/0182046 | A1 * | 7/2011 | Shiota | H05K 3/323 | 361/760 |
| 2012/0026700 | A1 * | 2/2012 | Furuta | H05K 3/361 | 361/750 |
| 2012/0085579 | A1 * | 4/2012 | Tatsuzawa | H05K 3/323 | 174/84 R |
| 2012/0138868 | A1 * | 6/2012 | Arifuku | B82Y 10/00 | 252/510 |
| 2012/0184130 | A1 * | 7/2012 | Yaguchi | H01R 12/53 | 439/493 |
| 2013/0252443 | A1 * | 9/2013 | Hotta | G01R 1/0735 | 439/66 |
| 2014/0011390 | A1 * | 1/2014 | Hasegawa | H01R 12/62 | 439/371 |
| 2015/0101855 | A1 * | 4/2015 | Wu | H05K 3/36 | 174/261 |
| 2015/0214255 | A1 * | 7/2015 | Chikama | H01L 29/66765 | 257/43 |
| 2015/0325937 | A1 * | 11/2015 | Mikage | H05K 3/321 | 439/493 |
| 2016/0098111 | A1 * | 4/2016 | Tsukamoto | G06F 3/044 | 345/173 |
| 2017/0184903 | A1 * | 6/2017 | Fujikawa | G02F 1/13458 | |
| 2018/0063969 | A1 * | 3/2018 | Philibert | H01R 12/62 | |
| 2018/0111356 | A1 * | 4/2018 | Effertz | B60Q 1/00 | |
| 2018/0124924 | A1 * | 5/2018 | Cho | B21J 9/022 | |

* cited by examiner

SYSTEMS AND METHODS FOR SURFACE MOUNTING CABLE CONNECTIONS

BACKGROUND

Embodiments herein generally relate to methods and devices using surface mounted connections for joining cables and circuit boards.

Today, various types of computing devices (e.g., computers, tablets) may utilize circuit boards that are coupled to other circuit boards or components via cables. Currently utilized cables however may include connector ends that are relatively thick, and/or expensive. The use of relatively thick connectors limits how thin computing devices may be. For example, clamp and lock connectors may be utilized, but they are relatively thick (e.g., 2 millimeters or more), and may be expensive. As another example, a cable end may be inserted into a plug that extends above the plane of the circuit board. Such connectors, however, require that the cable be elevated a distance above the board, increasing thickness.

SUMMARY

In accordance with embodiments herein, a device is provided. The device includes a system component that has a circuit board that includes a cable connection portion. The cable connection portion is disposed on and extends along a mounting surface, and includes board pads disposed on the mounting surface within the cable connection portion. The board pads define corresponding board contact surfaces for electrical coupling with connector pads, and include a board adhesive material disposed on the corresponding board contact surfaces.

In accordance with embodiments herein, a system is provided. The system includes one or more cables and one or more system components operatively coupled via the one or more cables, with the one or more system components each having a circuit board. The cable has a planar connector end. The planar connector end has a connector surface, and the connector surface has connector pads disposed thereon. The connector pads are in electrical communication with cable traces. The connector pads include a connector adhesive material disposed thereon. The circuit board includes a cable connection portion. The cable connection portion is disposed on and extends along a mounting surface for coupling with the planar connector end of the one or more cables. The cable connection portion includes board pads disposed on the mounting surface within the cable connection portion. The board pads define corresponding board contact surfaces for electrical coupling with the connector pads of the planar connector end of the one of the one or more cables. The board pads include a board adhesive material disposed on the corresponding board contact surfaces. The planar connector end of the one of the one or more cables and the cable connection portion of the circuit board define a connection plane when the connector pads are coupled to the board pads.

In accordance with embodiments herein, a method is provided. The method includes providing one or more cables having a planar connector end. The planar connector end has a connector surface. The connector surface has connector pads disposed thereon, with the connector pads in electrical communication with cable traces. The connector pads include a connector adhesive material disposed thereon. The method also includes providing one more system components, with the one or more system components each having a circuit board. The circuit board includes a cable connection portion. The cable connection portion is disposed on and extends along a mounting surface, and includes board pads disposed on the mounting surface within the cable connection portion. The board pads define corresponding board contact surfaces for electrical coupling with the connector pads of the planar connector end of the cable. The board pads include a board adhesive material disposed on the corresponding board contact surfaces. Further, the method includes positioning the planar connector end with the connector surface oriented toward the mounting side of the circuit board. The method also includes aligning the connector pads of the planar connector end with the board pads of the circuit board, and adhering the connector pads of the planar connector end with the board pads of the circuit board. The planar connector end of the one or more cables and the cable connection portion of the circuit board define a connection plane when the connector pads are coupled to the board pads.

BRIEF DESCRIPTION OF THE DRAWINGS

The present subject matter will be better understood from reading the following description of non-limiting embodiments, with reference to the attached drawings, wherein below.

DETAILED DESCRIPTION

Figure 1:
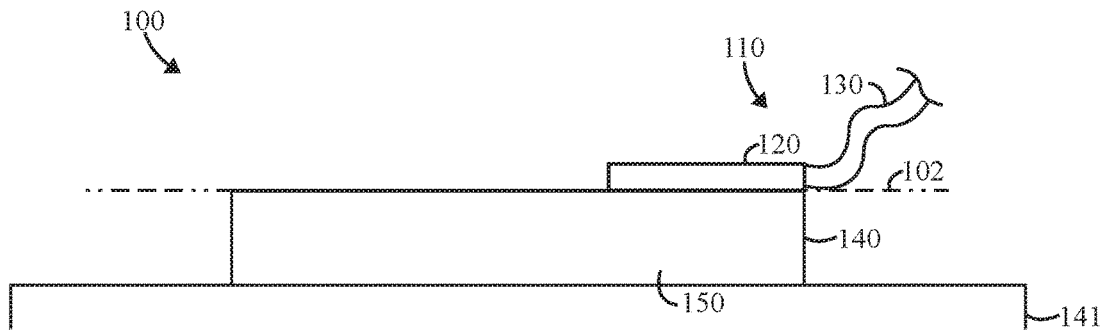
FIG. 1 illustrates a side view of a system in accordance with embodiments herein.

It will be readily understood that the components of the embodiments as generally described and illustrated in the figures herein, may be arranged and designed in a wide variety of different configurations in addition to the described example embodiments. Thus, the following more detailed description of the example embodiments, as represented in the figures, is not intended to limit the scope of the embodiments, as claimed, but is merely representative of example embodiments.

Reference throughout this specification to "one embodiment" or "an embodiment" (or the like) means that a particular feature, structure, or characteristic described in connection with the embodiment is included in at least one embodiment. Thus, appearances of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the following description, numerous specific details are provided to give a thorough understanding of embodiments. One skilled in the relevant art will recognize, however, that the various embodiments can be practiced without one or more of the specific details, or with other methods, components, materials, and/or the like. In other instances, well-known structures, materials, or operations are not shown or described in detail to avoid obfuscation. The following description is intended only by way of example and simply illustrates certain example embodiments.

It should be clearly understood that the various arrangements and processes broadly described and illustrated with respect to the Figures, and/or one or more individual components or elements of such arrangements and/or one or more process operations associated of such processes, can be employed independently from or together with one or more other components, elements and/or process operations described and illustrated herein. Accordingly, while various arrangements and processes are broadly contemplated, described and illustrated herein, it should be understood that they are provided merely in illustrative and non-restrictive fashion, and furthermore can be regarded as but mere examples of possible working environments in which one or more arrangements or processes may function or operate.

Embodiments described herein provide for low-profile connections between cables and circuit boards. Various embodiments provide connections that are significantly thinner than plug-in cables, allowing for thinner computing devices. Various embodiments utilize a conductive epoxy, with two portions of the epoxy brought together between connector and board contact pads, resulting in the reaction of the epoxy to create a permanent electrical bond between the connector and board contact pads.

Various embodiments use the end of a flat cable having plated contacts, with the contacts arranged as small pads in the middle of a side insulating area of the flat cable. For example, for relatively small numbers of wide conductors on a parallel flat cable, the insulating area may be the existing cable trace gaps, and the pads arranged as the ends of the traces.

FIG. 1 provides a side view of a system 100 formed in accordance with various embodiments. The system 100 includes a cable 110 and a circuit board 140. The system 100 is configured to provide a flush or low-profile mounting of the cable 110 to the circuit board 140, with the cable 110 electrically coupled to the circuit board. As seen in FIG. 1, the cable 110 and circuit board 140 define a connection plane 102 when the cable 110 is coupled to the circuit board 140. The connection plane is generally parallel to the circuit board 140 (e.g., an upper surface of the circuit board) and may be defined by contact points between contacts of the cable 110 and contacts of the circuit board 140. The coupling of the cable 110 and circuit board 140 (e.g., defining a connection plane as discussed herein) provides for a lower profile than using a separate board mounted connector into which a cable plugs into. The circuit board 140 and cable 110 may be understood as having corresponding faces that extend parallel to one another, with the circuit board 140 and cable 110 coupled along the faces. As seen in FIG. 1, the circuit board 140 is part of a system component 141. Further, it may be noted that while one cable 110, one circuit board 140, and one system component 141 are shown in FIG. 1, one or more cables 110, one or more circuit boards 140, and one or more system components 141 may be utilized in various embodiments. For example, some embodiments may include one or more system components 141 operatively coupled via one or more cables 110, with each of the one or more system components 141 each having a circuit board 140 (or more than one circuit board 140).

Figure 2:
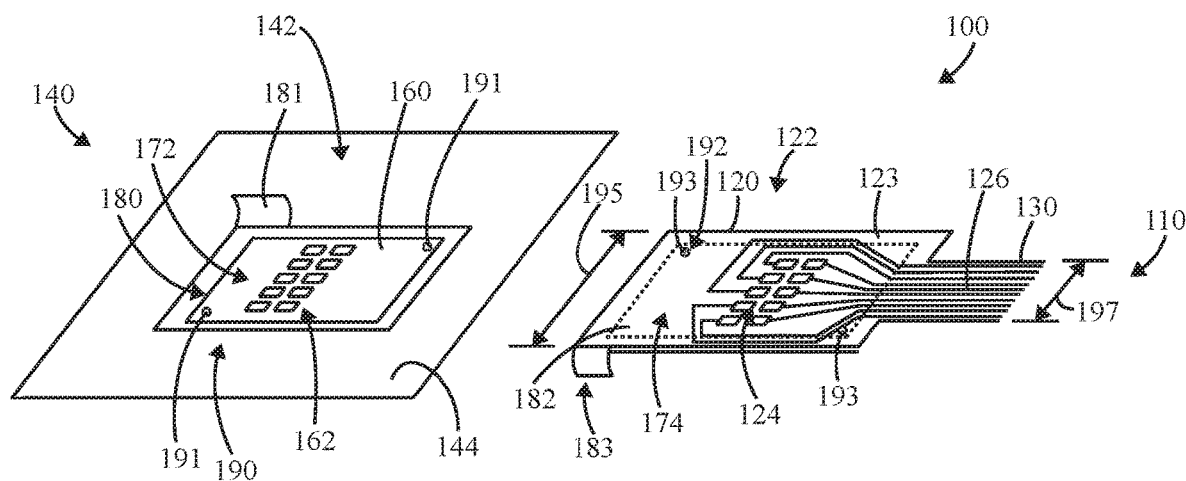
FIG. 2 illustrates an exploded perspective view of the system of FIG. 1.

FIG. 2 provides an exploded perspective view of the system 100. As seen in FIG. 2, the cable 110 includes a planar connector end 120 and a flat cable portion 130. In the illustrated example, the flat cable portion 130 extends from the planar connector end 120. It may be noted that, in other embodiments, a round cable or other cable may be coupled to the planar connector end 120 instead of a flat cable. The planar connector end 120 of the illustrated embodiment is generally flat and thin, to provide a low profile when coupled to the circuit board 140. In the depicted embodiment, the planar connector end 120 has a generally rectangular surface area or shape.

Figure 3:
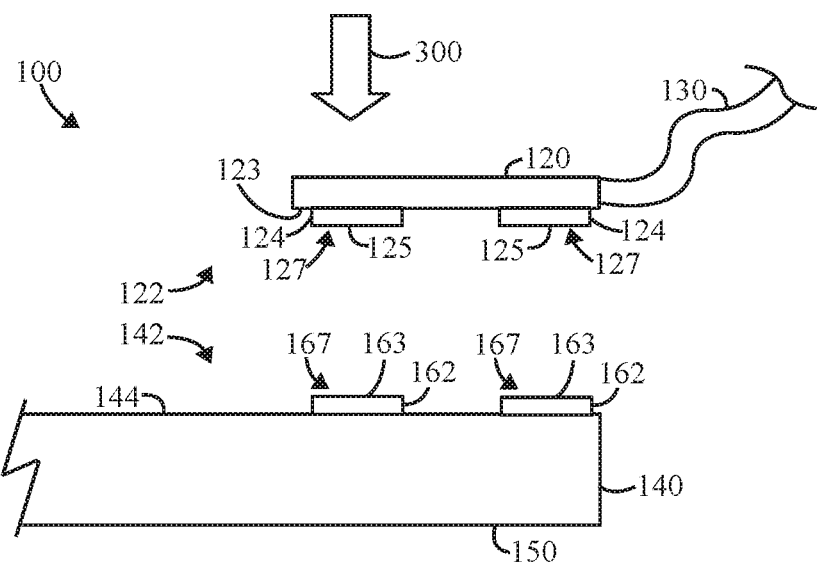
FIG. 3 illustrates an exploded side view of the system of FIG. 1.
Figure 4:
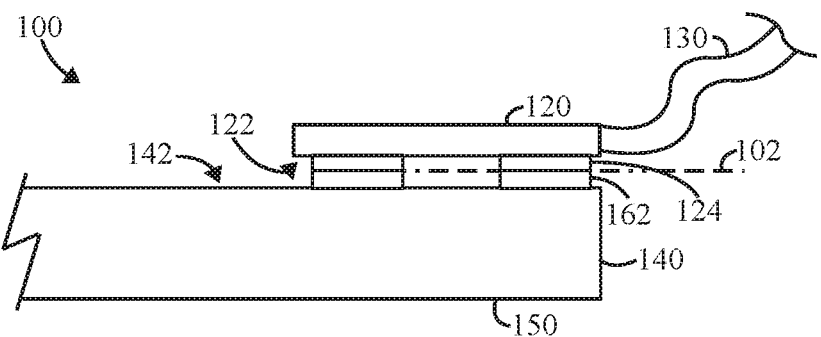
FIG. 4 illustrates an enlarged view of contacts of the system of FIG. 1.

In various embodiments, the flat cable portion 130 may be a flexible ribbon with traces disposed thereon (e.g., cable traces 126). The flat cable portion 130 extends from the planar connector end 120, and may be used to electrically couple the planar connector end 120 (along with the circuit board 140 when the planar connector end 120 is coupled to the circuit board 140) to one or more additional components (not shown). As seen in FIG. 2, the depicted planar connector end 120 has an end width 195, and the depicted flat cable portion 130 has a cable width 197. The end width 195 is greater than the cable width 197 in the illustrated example As seen in FIGS. 2-4, the planar connector end 120 has a connection side 122 with a connector surface 123 on the connection side 122. Generally, the connection side 122 is configured to be oriented toward the circuit board 140 when the cable 110 is coupled to the circuit board 140. The planar connector end 120 includes one or more features disposed on the connection side 122 that interact or cooperate with one or more aspects of the circuit board 140 to couple the planar connector end 120 to the circuit board electrically and/or mechanically. For example, in the illustrated embodiment, contact pads of the planar connector end 120 cooperate with corresponding contact pads of the circuit board 140 to couple the cable 110 to the circuit board 140.

The planar connector end 120 includes connector pads 124 disposed on the connector surface 123. The connector pads 124 are in electrical communication with cable traces 126. The cable traces 126 are in turn electrically coupled with one or more components (not shown in FIG. 2), allowing for the one or more components to be placed in electrical communication with the circuit board 140 when the cable 110 is coupled to the circuit board 140.

Further, the connector pads 124 define corresponding connector contact surfaces 125 (see also FIG. 3 and related discussion). For example, each connector pad 124 may include a generally flat connector contact surface 125 that is oriented toward the circuit board 140 when the planar connector end 120 is coupled to the circuit board 140. The connector pads 124 include a connector adhesive material 127 disposed on the corresponding connector contact surfaces 125. The adhesive material 127 is configured to secure the connector contact surfaces 125 of the connector pads 124 of the cable 110 to corresponding connector pads of the circuit board 140. As the connector pads 124 are configured for electrical coupling with the circuit board 140, the adhesive material 127 is made of an electrically conductive material.

The circuit board 140 includes a substrate 150 and a cable connection portion 160. The circuit board 140 had a mounting side 142 that is configured for coupling with the connection side 122 of the planar connector end 120 of the cable 110, and has a mounting surface 144 disposed on the mounting side 142. The mounting side 142 (and mounting surface 144) is oriented toward the planar connector end 120 when the cable 110 is coupled to the circuit board 140.

Generally, the mounting side 142 includes features that cooperate with corresponding features of the connection side 122 of the planar connector end 120 to couple the planar connector 120 to the circuit board 140. In various embodiments, the features may include electrically conductive features such as contact pads. Further, the features may include projections, opening, or the like configured to align the planar connector end 120 in a desired position with respect to the circuit board 140.

In the illustrated example, the circuit board 140 includes a cable connection portion 160 disposed on and extending along the mounting surface 144. Generally, the cable connection portion 160 is configured to cooperate with the planar connector end 120 to electrically and physically couple the cable 110 to the circuit board 140. In the illustrated embodiment, the cable connection portion 160 defines a generally rectangular area or foot print. The cable connection potion 160 in various embodiments includes contacts for electrically coupling to the cable 110. For example, the depicted cable connection portion 160 includes board pads 162 that are disposed on the mounting surface 144 within the cable connection portion 160. The board pads 162 include corresponding board contact surfaces 163 (see, FIG. 3) that are configured for electrical coupling with the connector pads 124 of the planar connector end 120 of the cable 110. The connector pads 124 of the planar connector end 120 of the illustrated example are configured in an array that matches or corresponds to an array of the board pads 162, with each individual connector pad 124 positioned to contact and mount to a particular, predetermined board pad 162. The depicted board pads 162 include a board adhesive material 167 disposed on the corresponding board contact surfaces 163. As the board pads 162 are configured for electrical coupling with the cable 110, the adhesive material 167 is made of an electrically conductive material. Accordingly, the board pads 162 may be physically (via the adhesive) and electrically coupled to the connector pads 124.

As shown in FIGS. 3 and 4, to couple the cable 110 with the circuit board 140, the connection side 122 of the cable 110 is urged toward the mounting side 142 of the circuit board 140 along direction 300, with the connector pads 124 of the planar connector end 120 of the cable 110 aligned with the board pads 162 of the cable connection portion 160 of the circuit board 140. As the connector pads 124 are brought into contact with the board pads 162, the connector pads 124 and board pads 160 are joined at the connection plane 102, defining the connection plane 102. As seen in FIG. 4, with the planar connector end 120 coupled to the circuit board 140, the planar connector end 120 is essentially flush with the circuit board 140, with only the thickness of the connector pads separating a main body of the planar connector end 120 from the substrate 150 of the circuit board 140. Accordingly, the height of the planar connector end 120 from the mounting surface 144 may be only the thickness of the contact pads plus the thickness of the planar connector end 120. The adhesive of the contact pads acts to secure the planar connector end 120 to the circuit board 140 without requiring additional plugs. It may be noted that in the illustrated embodiment only one side of the circuit board 140 is depicted as a mounting side 142; however, both sides in various embodiments may be configured as mounting sides, with a first planar connector end of a first cable mounted to one side of the circuit board, and with a second planar connector end of a second cable mounted to the opposite side of the circuit board.

Figure 5:
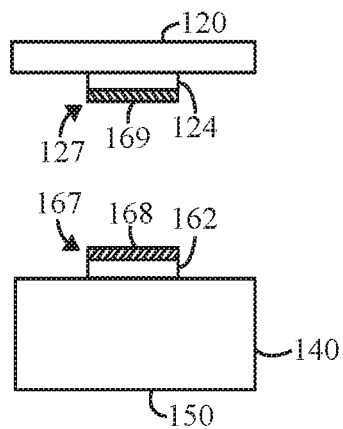
FIG. 5 illustrates a view of a circuit board and a connector end before being joined with an epoxy, in accordance with embodiments herein.
Figure 6:
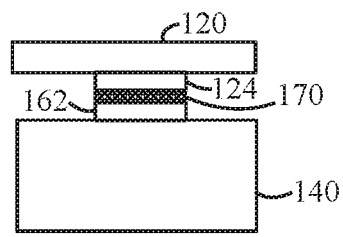
FIG. 6 illustrates a view of the circuit board and connector of FIG. 5 after being joined with the epoxy.

As discussed herein, adhesive is used in various embodiments to secure the connector pads 124 to the board pads 162. In some embodiments, a 2-part epoxy may be employed. For example, for the embodiment depicted in FIGS. 5 and 6, the board adhesive material 167 includes a first portion 168 of an epoxy 170, and the connector adhesive material 127 includes a second portion 169 of the epoxy 170. The pads are shown separated, with the epoxy 170 not yet mixed or formed in FIG. 5. In FIG. 6, the pads are shown brought into contact, with the first portion 168 and the second portion 169 mixed to form the epoxy 170. The first portion 168 and the second portion 169 are configured to cooperate to secure the pads together when the board pads 162 and the contact pads are brought into contact with each other. For example, the individual portions of the epoxy 170 may be inert or non-adhesive when apart from each other, but when mixed may be activated to form an adhesive that bonds or secures each board pad 162 to a corresponding connector pad. The depicted epoxy 170 is conductive, allowing electrical communication via the pads secured together by the epoxy 170. Use of a 2-part conductive epoxy allows for convenient and secure mounting of the cable 110 to the circuit board 140.

It may be noted that the epoxy 170 may take time to cure after the first portion 168 and the second portion 169 are mixed, and/or it may be desirable to provide additional securement between the circuit board 140 and the cable 110 when they are coupled. Accordingly, in various embodiments, additional adhesive is used to secure additional aspects of the system 100. For example, with continued reference to FIG. 2, the cable connection portion 160 of the circuit board 140 includes a non-conductive board adhesive portion 172 disposed on the mounting surface 144, and the planar connector end 120 includes a non-conductive cable adhesive portion 174 disposed on the connector surface 123. For example, the non-conductive board adhesive portion 172 and the non-conductive adhesive portion 174 may be located so that they contact each other when the board pads 162 and the connector pads 124 are aligned and brought into contact with each other, and one or both of the non-conductive board adhesive portion 172 and the non-conductive adhesive portion 174 may be coated or otherwise include an adhesive (e.g., non-conductive glue, high strength insulating contact cement). Because electrical communication is not required via the non-conductive board adhesive portion 172 and the non-conductive adhesive portion 174, a non-conductive adhesive may be used, for example to provide a quicker curing time and/or to reduce cost. Accordingly, the circuit board 140 and the planar connector end 124 of the cable 110 may be secured together by the non-conductive adhesive to hold the circuit board 140 and the planar connector end 124 together while a conductive epoxy cures, and/or to provide additional securement.

In the illustrated example, the circuit board 140 includes a board adhesive covering sheet 180. The board adhesive covering sheet 180 is configured to be removed from the cable connection portion 160 before coupling with the cable 110. For example, the depicted board adhesive covering sheet 180 includes a tab 181 for grasping and peeling the board adhesive covering sheet 180 off of the circuit board 140. Also, the depicted cable 110 includes a cable adhesive covering sheet 182 that is configured to be removed from the planar connector end 120 before electrical coupling with the circuit board 140. For example, the depicted cable adhesive covering sheet 182 includes a tab 183 for grasping and peeling the cable adhesive covering sheet 182 off of the planar connector end 120. In the illustrated embodiment, the adhesive covering sheets of the cable 110 and the circuit board 140 cover both the corresponding non-conductive adhesive portion and the corresponding conductive adhesive portions (e.g., pads). In various embodiments, use of removable adhesive covering sheets provides for protection against inadvertent use or dilution of adhesive before the cable 110 is coupled to the circuit board 140.

Mounting features may be employed in various embodiments to help ensure proper alignment of one or more aspects of the planar connector end 120 of the cable 110 with the circuit board 140 (e.g., to align an array of connector pads with an array of board pads, to align non-conductive adhesive portions of the planar connector end 120 and the circuit board 140). As shown in FIG. 2, the circuit board 140 includes a board guide feature 190 that is disposed within the cable connection portion 160. Also, the cable 110 includes a cable guide feature 192 disposed on the planar connector end 120. The board guide feature 190 and the cable guide feature 192 are configured to cooperate to align the board pads 162 with the connector pads 124. For example, the board mounting features may be positioned at predetermined locations with respect to arrays of board pads 162 and connector pads 124, such that the arrays are aligned with each other when the guide features are coupled to each other or otherwise aligned. In the illustrated embodiment, the board guide feature 190 includes a post 191, and the cable guide feature 192 includes an opening 193. The opening 193 is configured (e.g., sized and positioned) to accept the post 191. Use of mounting features in various embodiments provides convenient and accurate alignment of connector pads when the cable 110 is coupled to the circuit board 140. It may be noted that plural mounting features may be employed in various embodiments for additional accuracy and/or convenience. For example, in the example depicted in FIG. 2, there are two posts 191 and two corresponding openings 193.

Figure 7:
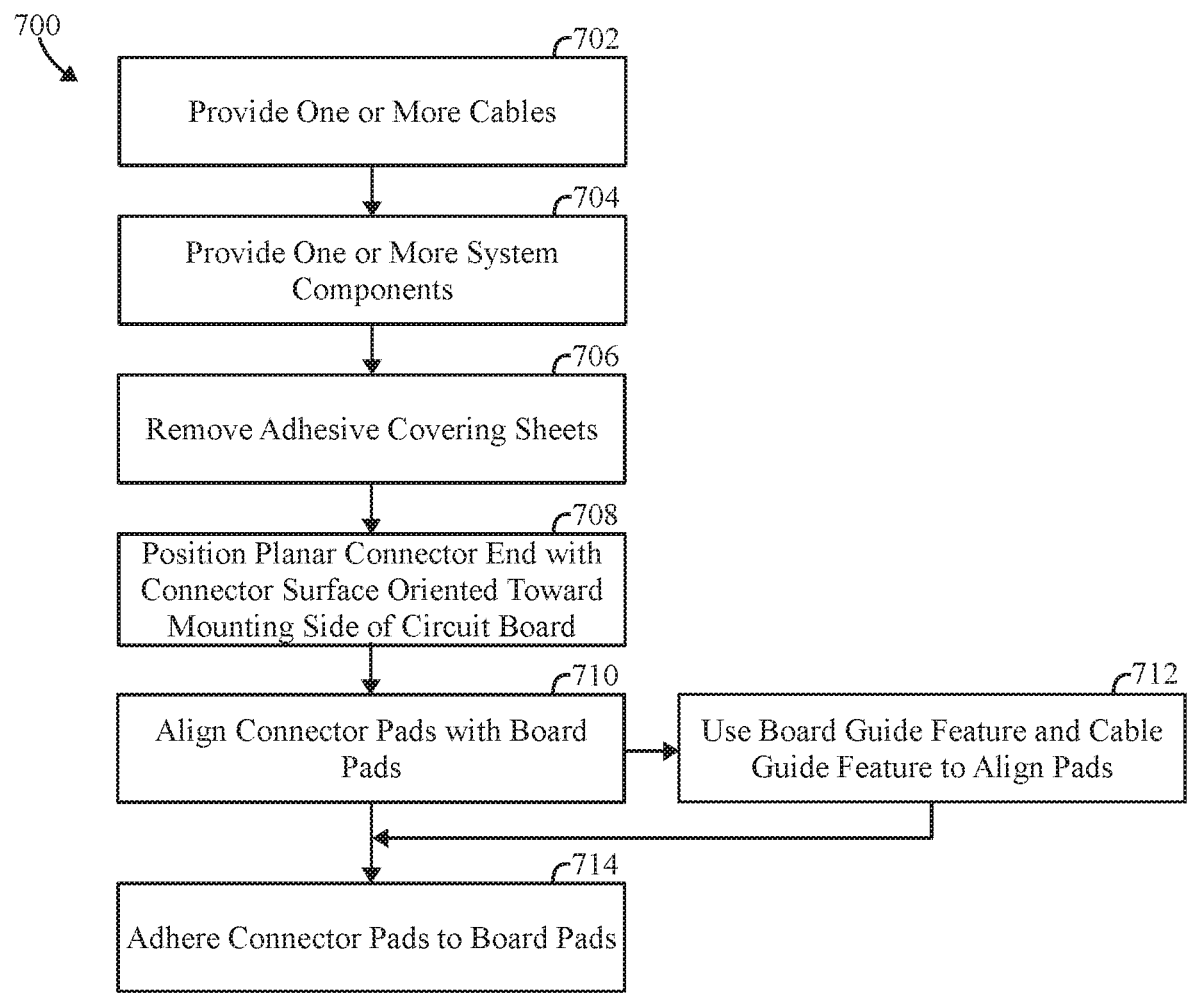
FIG. 7 illustrates a flowchart of a method in accordance with embodiments herein.

FIG. 7 illustrates a method 700 (e.g., a method of coupling a cable to a circuit board). The method 700, for example, may employ or be performed by or with structures or aspects of various embodiments discussed herein. In various embodiments, certain steps may be omitted or added, certain steps may be combined, certain steps may be performed concurrently, certain steps may be split into multiple steps, certain steps may be performed in a different order, or certain steps or series of steps may be re-performed in an iterative fashion.

At 702, one or more cables are provided. In various embodiments, one or more aspects of the one or more cables are configured generally similar to cable 110. For example, the cable in various embodiments includes a planar connector end having a connection side, with a connector surface on the connector side. Further, the connector surface in various embodiments has connector pads disposed thereon in electrical communication with cable traces. The connector pads may include a connector adhesive material disposed on connector contact surfaces of the connector pads.

At 704, one or more system components are provided, with the one or more system components each having a circuit board. In various embodiments, one or more aspects of the circuit board are configured generally similar to circuit board 140. For example, the circuit board in various embodiments includes a substrate and a cable connection portion. The circuit board may define a mounting side configured for coupling with the connection side of the planar connector end of the cable, with a mounting surface disposed on the mounting side. Further, in various embodiments, the cable connection portion is disposed on and extends along the mounting surface, and includes board pads. The board pads define corresponding board contact surfaces that are configured for electrical coupling with the connect pads of the planar connector end of the cable. The board pads may include a board adhesive material disposed on the corresponding board contact surfaces.

At 706, a board adhesive covering sheet is removed from the cable connection portion of the board, and a cable adhesive covering sheet is removed from the planar connector end, before electrically (and physically) coupling the cable with the circuit board. The board adhesive covering sheet may be used to cover adhesive on the board pads until the cable and circuit board are to be coupled, and the cable adhesive covering sheet may be used to cover adhesive on the contact pads. Alternatively or additionally, one or more of the covering sheets (or additional covering sheets) may be used to cover non-conductive adhesive portions of the circuit board and/or planar connector end.

At 708, the planar connector end is positioned with the connector surface oriented toward the mounting side of the circuit board. At 710, the connector pads of the planar connector end are aligned with the board pads of the circuit board. For example, at 712, a board guide feature and a cable guide feature are used to align the board pads with the connector pads. In various embodiments, the board guide feature is disposed within the cable connection portion of the circuit board and the cable guide feature is disposed on the planar connector end of the cable. In some embodiments, the board guide feature includes one or more posts extending from the mounting surface of the circuit board, and the cable guide feature includes one or more openings configured to accept the one or more posts.

At 714, the connector pads of the planar connector end are adhered with the board pads of the circuit board. In various embodiments, with the connector pads and board pads aligned, the planar connector end and circuit board are urged toward each other until the board pads and connector pads contact each other, with the conductive adhesive material on the connector pad surfaces and/or on the board pad surfaces acting to adhere the board pads to the connector pads, thereby electrically coupling the board pads with the contact pads (and, accordingly, electrically coupling the cable with the circuit board), as well as securing the board pads and connector pads together. With the board pads and connector pads secured together, the planar connector end of the cable and the cable connection portion of the circuit board define a connection plane. In some embodiments, the board adhesive material includes a first portion of an epoxy, and the connector adhesive material comprises a second portion of the epoxy, with the first and second portions configured to cooperate to form a non-conductive epoxy when mixed or brought together. In such embodiments, the method 700 may further include contacting the connector pads with the board pads to activate the epoxy.

In various embodiments, additional adhesive may be employed, for example to provide additional security to the mounting of the planar connector end to the circuit board and/or to secure the planar connector end to the circuit board while an epoxy cures. For example, in various embodiments, a non-conductive board adhesive portion of the circuit board is adhered to a non-conductive cable adhesive portion of the planar contact end of the cable. One or both of the non-conductive board adhesive portion or non-conductive cable adhesive portion may be coated with or include a non-conductive adhesive agent (e.g., glue) for securing the planar connector end with the circuit board.

Closing Statements

As will be appreciated by one skilled in the art, various aspects may be embodied as a system, method or computer (device) program product. Accordingly, aspects may take the form of an entirely hardware embodiment or an embodiment including hardware and software that may all generally be referred to herein as a "circuit," "module" or "system." Furthermore, aspects may take the form of a computer (device) program product embodied in one or more computer (device) readable storage medium(s) having computer (device) readable program code embodied thereon.

Any combination of one or more non-signal computer (device) readable medium(s) may be utilized. The non-signal medium may be a storage medium. A storage medium may be, for example, an electronic, magnetic, optical, electromagnetic, infrared, or semiconductor system, apparatus, or device, or any suitable combination of the foregoing. More specific examples of a storage medium would include the following: a portable computer diskette, a hard disk, a random access memory (RAM), a dynamic random access memory (DRAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Program code for carrying out operations may be written in any combination of one or more programming languages. The program code may execute entirely on a single device, partly on a single device, as a stand-alone software package, partly on single device and partly on another device, or entirely on the other device. In some cases, the devices may be connected through any type of network, including a local area network (LAN) or a wide area network (WAN), or the connection may be made through other devices (for example, through the Internet using an Internet Service Provider) or through a hard wire connection, such as over a USB connection. For example, a server having a first processor, a network interface, and a storage device for storing code may store the program code for carrying out the operations and provide this code through its network interface via a network to a second device having a second processor for execution of the code on the second device.

Aspects are described herein with reference to the figures, which illustrate example methods, devices and program products according to various example embodiments. These program instructions may be provided to a processor of a general purpose computer, special purpose computer, or other programmable data processing device or information handling device to produce a machine, such that the instructions, which execute via a processor of the device implement the functions/acts specified. The program instructions may also be stored in a device readable medium that can direct a device to function in a particular manner, such that the instructions stored in the device readable medium produce an article of manufacture including instructions which implement the function/act specified. The instructions may also be loaded onto a device to cause a series of operational steps to be performed on the device to produce a device implemented process such that the instructions which execute on the device provide processes for implementing the functions/acts specified.

The units/modules/applications herein may include any processor-based or microprocessor-based system including systems using microcontrollers, reduced instruction set computers (RISC), application specific integrated circuits (ASICs), field-programmable gate arrays (FPGAs), logic circuits, and any other circuit or processor capable of executing the functions described herein. Additionally or alternatively, the units/modules/controllers herein may represent circuit modules that may be implemented as hardware with associated instructions (for example, software stored on a tangible and non-transitory computer readable storage medium, such as a computer hard drive, ROM, RAM, or the like) that perform the operations described herein. The above examples are exemplary only, and are thus not intended to limit in any way the definition and/or meaning of the term "controller." The units/modules/applications herein may execute a set of instructions that are stored in one or more storage elements, in order to process data. The storage elements may also store data or other information as desired or needed. The storage element may be in the form of an information source or a physical memory element within the modules/controllers herein. The set of instructions may include various commands that instruct the units/modules/applications herein to perform specific operations such as the methods and processes of the various embodiments of the subject matter described herein. The set of instructions may be in the form of a software program. The software may be in various forms such as system software or application software. Further, the software may be in the form of a collection of separate programs or modules, a program module within a larger program or a portion of a program module. The software also may include modular programming in the form of object-oriented programming. The processing of input data by the processing machine may be in response to user commands, or in response to results of previous processing, or in response to a request made by another processing machine.

It is to be understood that the subject matter described herein is not limited in its application to the details of construction and the arrangement of components set forth in the description herein or illustrated in the drawings hereof. The subject matter described herein is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

It is to be understood that the above description is intended to be illustrative, and not restrictive. For example, the above-described embodiments (and/or aspects thereof) may be used in combination with each other. In addition, many modifications may be made to adapt a particular situation or material to the teachings herein without departing from its scope. While the dimensions, types of materials and coatings described herein are intended to define various parameters, they are by no means limiting and are illustrative in nature. Many other embodiments will be apparent to those of skill in the art upon reviewing the above description. The scope of the embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects or order of execution on their acts.

What is claimed is:

1. A system for surface mounting cable connections comprising: one or more cables having a planar connector end, the planar connector end having a connector surface, the connector surface having connector pads disposed thereon, the connector pads in electrical communication with cable traces, the connector pads including a connector adhesive material disposed thereon, the connector pads arranged in an array of connector pads; and one or more system components operatively coupled via the one or more cables, the one or more system components each having a circuit board comprising: a cable connection portion disposed on and extending along a mounting surface for coupling with the planar connector end of the cable, the cable connection portion including board pads disposed on the mounting surface within the cable connection portion, the board pads defining corresponding board contact surfaces for electrical coupling with the connector pads of the planar connector end of one of the one or more cables, the board pads arranged in an array of board pads that matches the array of connector pads for individual coupling of each connector pad with a corresponding board pad, the board pads including a board adhesive material disposed on the corresponding board contact surfaces, wherein the planar connector end of the one of the one or more cables and the cable connection portion of the circuit board define a connection plane when the connector pads are coupled to the board pads, wherein an open gap is defined between adjacent connector pads when the connector pads are coupled to the board pad;

wherein the cable connection portion of the circuit board comprises a non-conductive board adhesive portion and the planar connector end comprises a non-conductive cable adhesive portion disposed on the connector surface, the non-conductive board adhesive portion and the non-conductive cable adhesive portion cooperating with each other to secure the planar connector end to the cable connection portion of the circuit board.

2. The system of claim 1, wherein the board adhesive material comprises a first portion of an epoxy and the connector adhesive material comprises a second portion of the epoxy, the first portion of the epoxy cooperating with the second portion of the epoxy when the board pads and connector pads are brought into contact with each other.

3. The system of claim 1, wherein the circuit hoard comprises a board adhesive covering sheet removable from the cable connection portion before electrical coupling with the one or more cables, and wherein the one or more cables comprises a cable adhesive covering sheet removable from the planar connector end before electrical coupling with the circuit board.

4. The system of claim 1, wherein the circuit board comprises a board guide feature disposed within the cable connection portion, and wherein the one or more cables comprises a cable guide feature disposed on the planar connector end, the board guide feature and cable guide feature cooperating to align the board pads with the connector pads.

5. The system of claim 4, wherein the board guide feature comprises a post extending from the mounting surface of the circuit board, and the cable guide feature comprises an opening that accepts the post.

6. The system of claim 5, wherein the one or more cables comprises a flat cable portion extending from the planar connector end.

7. The system of claim 6, wherein the planar connector end has an end width and the flat cable portion has a cable width, wherein the end width is greater than the cable width.

\* \* \* \* \*